US012393214B2

(12) United States Patent
Richmond et al.

(10) Patent No.: US 12,393,214 B2
(45) Date of Patent: Aug. 19, 2025

(54) DEVICE DESIGN FOR SHORT-CIRCUIT PROTECTION OF TRANSISTORS

(71) Applicant: Wolfspeed, Inc., Durham, NC (US)

(72) Inventors: James Richmond, Hillsborough, NC (US); Edward Robert Van Brunt, Raleigh, NC (US); Philipp Steinmann, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 57 days.

(21) Appl. No.: 18/093,838

(22) Filed: Jan. 6, 2023

(65) Prior Publication Data

US 2023/0152830 A1 May 18, 2023

Related U.S. Application Data

(63) Continuation of application No. 16/448,538, filed on Jun. 21, 2019, now Pat. No. 11,579,645.

(51) Int. Cl.
*G05F 1/569* (2006.01)
*G01R 31/50* (2020.01)
(Continued)

(52) U.S. Cl.
CPC ............. *G05F 1/569* (2013.01); *G01R 31/50* (2020.01); *G05F 3/20* (2013.01); *H10D 62/8325* (2025.01)

(58) Field of Classification Search
CPC ................................................ H02H 9/04–046
See application file for complete search history.

(56) References Cited

U.S. PATENT DOCUMENTS 4,142,115 A 2/1979 Nakata et al.
4,760,434 A 7/1988 Tsuzuki et al.
(Continued)

FOREIGN PATENT DOCUMENTS

EP 0224274 A2 6/1987
EP 0437939 A1 7/1991
(Continued)

OTHER PUBLICATIONS

International Search Report and Written Opinion for International Patent Application No. PCT/US2020/036251, mailed Sep. 1, 2020, 14 pages.

(Continued)

*Primary Examiner* — Sean Kayes
*Assistant Examiner* — Nusrat Quddus
(74) *Attorney, Agent, or Firm* — Myers Bigel, P.A.

(57) ABSTRACT

A transistor semiconductor die includes a first current terminal, a second current terminal, and a control terminal. A semiconductor structure is between the first current terminal, the second current terminal, and the control terminal and configured such that a resistance between the first current terminal and the second current terminal is based on a control signal provided at the control terminal. Short circuit protection circuitry is coupled between the control terminal and the second current terminal. In a normal mode of operation, the short circuit protection circuitry is configured to provide a voltage drop that is greater than a voltage of the control signal. In a short circuit protection mode of operation, the short circuit protection circuitry is configured to provide a voltage drop that is less than a voltage of the control signal.

26 Claims, 11 Drawing Sheets

(51) Int. Cl.

*G05F 3/20* (2006.01)

*H10D 62/832* (2025.01)

(56) References Cited

U.S. PATENT DOCUMENTS

- 4,893,159 A 1/1990 Suzuki et al.
- 5,119,162 A 6/1992 Todd et al.
- 5,311,391 A 5/1994 Dungan et al.
- 5,631,494 A * 5/1997 Sakurai ............... H01L 27/0251 257/E29.198
- 5,691,557 A 11/1997 Watanabe
- 5,754,074 A 5/1998 Kelly
- 5,812,006 A * 9/1998 Teggatz ............. H03K 17/0822 327/309
- 5,825,603 A 10/1998 Parat et al.
- 5,886,543 A 3/1999 Moody
- 5,894,200 A * 4/1999 Goodale, Jr. ........ H05B 39/047 315/307
- 5,978,192 A 11/1999 Young et al.
- 6,541,826 B2 * 4/2003 Iwagami ............. H01L 27/0248 438/210
- 6,906,386 B2 * 6/2005 Williams ................ H01L 23/62 257/E23.044
- 7,511,357 B2 * 3/2009 Hshieh ................ H01L 27/0255 257/481
- 8,022,505 B2 * 9/2011 Renaud ............... H01L 27/0259 257/355
- 8,437,109 B1 5/2013 Wu
- 8,743,518 B1 6/2014 Ozard
- 9,136,381 B1 9/2015 Kocon et al.
- 9,349,721 B2 5/2016 Saito et al.
- 9,379,181 B2 6/2016 Sugimoto
- 9,786,778 B1 10/2017 Morizuka
- 9,998,109 B1 6/2018 Das et al.
- 10,026,728 B1 7/2018 Agam et al.
- 10,529,812 B1 1/2020 Edwards
- 10,879,692 B2 12/2020 Kubo et al.
- 10,950,596 B2 3/2021 Zeng et al.
- 11,322,610 B2 5/2022 Kim et al.
- 2002/0018330 A1 2/2002 Bremond et al.
- 2003/0141918 A1 7/2003 Uno
- 2004/0084753 A1 5/2004 Fruth et al.
- 2004/0113172 A1 * 6/2004 Yasuda ............ H03K 17/08128 257/197
- 2005/0122748 A1 6/2005 Tadokoro et al.
- 2005/0167742 A1 8/2005 Challa et al.
- 2006/0113593 A1 6/2006 Sankin et al.
- 2006/0203400 A1 * 9/2006 Bodano ............... H01L 27/0658 257/E23.044
- 2006/0284276 A1 12/2006 Yilmaz
- 2007/0168638 A1 7/2007 Hepkin et al.
- 2007/0258176 A1 * 11/2007 Ball ....................... H05B 45/44 361/56
- 2007/0290738 A1 * 12/2007 Wendt ................ H03K 17/0822 327/427
- 2008/0258224 A1 10/2008 Hshieh
- 2008/0272828 A1 * 11/2008 Min ......................... G01K 7/01 327/512
- 2009/0195947 A1 8/2009 Ootsuka et al.
- 2010/0001783 A1 1/2010 Ronsisvalle et al.
- 2011/0049564 A1 3/2011 Guan et al.
- 2011/0073906 A1 3/2011 Bobde et al.
- 2011/0127586 A1 6/2011 Bobde et al.
- 2011/0227095 A1 * 9/2011 Treu ..................... H03K 17/567 257/77
- 2012/0007138 A1 1/2012 Nguyen
- 2012/0037955 A1 * 2/2012 Hirler ................. H01L 29/7397 257/140
- 2012/0120531 A1 5/2012 Abou-Khalil et al.
- 2012/0193676 A1 8/2012 Bobde et al.
- 2012/0236456 A1 * 9/2012 Yu .......................... H05B 47/25 361/91.1
- 2012/0292636 A1 11/2012 Zhang et al.
- 2013/0026493 A1 1/2013 Cheng et al.
- 2013/0063846 A1 3/2013 Pierco et al.
- 2013/0140616 A1 * 6/2013 Schulze .............. H01L 27/0251 257/296
- 2013/0146971 A1 6/2013 Hirler et al.
- 2013/0193454 A1 * 8/2013 Bergenek ............... H01C 7/112 257/536
- 2013/0314833 A1 11/2013 Smith et al.
- 2014/0111893 A1 4/2014 Kato et al.
- 2014/0138737 A1 5/2014 Bobde et al.
- 2014/0177113 A1 6/2014 Gueorguiev et al.
- 2014/0268443 A1 9/2014 Nassar et al.
- 2014/0332877 A1 11/2014 Noebauer et al.
- 2014/0334522 A1 * 11/2014 Meiser ................... H10N 19/00 374/178
- 2015/0021659 A1 1/2015 Rountree
- 2015/0028351 A1 1/2015 Van Brunt et al.
- 2015/0076521 A1 3/2015 Tanaka et al.
- 2015/0084118 A1 3/2015 Van Brunt et al.
- 2015/0084125 A1 3/2015 Pala et al.
- 2015/0138678 A1 5/2015 Parthasarathy et al.
- 2015/0162321 A1 6/2015 Briere
- 2015/0364468 A1 * 12/2015 Kiep ........................ H01C 7/04 257/329
- 2016/0013639 A1 * 1/2016 Willkofer ........... H03K 17/0828 361/56
- 2016/0043169 A1 2/2016 Guan et al.
- 2016/0148925 A1 * 5/2016 Tonazzo .............. H01L 27/0266 257/361
- 2016/0163689 A1 6/2016 Laven et al.
- 2016/0181391 A1 6/2016 Bobde et al.
- 2016/0247799 A1 8/2016 Stafanov et al.
- 2016/0285255 A1 9/2016 O'Donnell et al.
- 2017/0054360 A1 2/2017 Uemura
- 2017/0149430 A1 5/2017 Dupuy et al.
- 2017/0194438 A1 7/2017 Kumagai et al.
- 2017/0200785 A1 7/2017 Janssens
- 2017/0248646 A1 * 8/2017 Mauder .............. G01R 31/3277
- 2017/0256938 A1 9/2017 Fukuhara
- 2017/0338809 A1 11/2017 Stefanov et al.
- 2017/0345891 A1 11/2017 Van et al.
- 2017/0373491 A1 12/2017 Schork et al.
- 2018/0114788 A1 4/2018 Ahlers et al.
- 2018/0166994 A1 6/2018 Dorn et al.
- 2018/0166999 A1 * 6/2018 Pidutti ................ H01L 27/0676
- 2018/0269313 A1 9/2018 Bina et al.
- 2018/0301553 A1 10/2018 Weyers et al.
- 2018/0350797 A1 12/2018 Lee et al.
- 2018/0366569 A1 12/2018 Zeng et al.
- 2019/0067174 A1 2/2019 Seok
- 2019/0067493 A1 2/2019 Seok
- 2019/0131964 A1 5/2019 Bryant
- 2019/0198666 A1 6/2019 Kim et al.
- 2019/0287959 A1 9/2019 Hua et al.
- 2019/0393334 A1 12/2019 Weyers et al.
- 2020/0035669 A1 1/2020 Tamaru et al.
- 2020/0169079 A1 5/2020 Smith
- 2020/0212664 A1 7/2020 Takuma et al.
- 2020/0335493 A1 10/2020 Arnold et al.
- 2020/0343721 A1 10/2020 Parthasarathy et al.
- 2020/0403397 A1 * 12/2020 Nakagawa ............. H02H 5/041
- 2021/0193646 A1 6/2021 Zeng et al.
- 2022/0044982 A1 * 2/2022 Mongin .................. H01L 23/66
- 2022/0102487 A1 3/2022 Siemieniec et al.
- 2022/0271156 A1 * 8/2022 Peters ...................... G01K 7/16

FOREIGN PATENT DOCUMENTS

- EP 0702455 A2 3/1996
- EP 1041634 A1 * 10/2000 ......... H01L 27/0255
- EP 1063757 A2 12/2000
- EP 3419170 A1 12/2018
- JP 62229866 A 10/1987
- JP H11251594 A 9/1999
- JP 2005175054 A 6/2005
- JP 2006041441 A 2/2006
- JP 2008172411 A 7/2008
- JP 5272183 B2 5/2013
- JP 2014216465 A 11/2014

(56) References Cited

FOREIGN PATENT DOCUMENTS

| | | | |
|---|---|---|---|
| JP | 2015103605 | A | 6/2015 |
| JP | 2015115608 | A | 6/2015 |
| WO | 2013161420 | A1 | 10/2013 |

OTHER PUBLICATIONS

"Japanese Office Action in Corresponding Patent Application No. 2021-576295, dated Mar. 10, 2023, 15 pages".
"Translation of Japanese Office Action in Corresponding Patent Application No. 2023-172691, mailed Mar. 11, 25, 4 pages".

* cited by examiner

DEVICE DESIGN FOR SHORT-CIRCUIT PROTECTION OF TRANSISTORS

CROSS-REFERENCE TO RELATED APPLICATION

The present application claims priority under 35 U.S.C. § 120 as a continuation of U.S. patent application Ser. No. 16/448,538, filed Jun. 21, 2019, the entire content of which is incorporated herein by reference as if set forth fully herein.

FIELD

The present disclosure is related to transistor semiconductor die, and in particular to transistor semiconductor die with improved protection against short circuit events.

BACKGROUND

Transistor devices such as metal-oxide semiconductor field-effect transistors (MOSFETs), insulated gate bipolar transistors (IGBTs), junction field-effect transistors (JFETs), and bipolar junction transistors (BJTs) are often used in power electronics, in which they may be used to selectively deliver current to and from a load. In certain situations, a load may provide a short circuit across a transistor device. Such a short circuit event may cause the transistor device to fail.

In recent years, there has been a push towards using wide bandgap semiconductor material systems for devices used in power electronics. For example, silicon carbide transistors are now in widespread use in power electronics. Compared to their silicon counterparts, silicon carbide transistors provide better performance, for example, by providing higher blocking voltage, lower on-state resistance, and lower switching loss. Silicon carbide transistors are also much smaller in size, and thus have higher current density. Accordingly, the short circuit withstand time, or the amount of time that a device can survive without failure during a short circuit event, of a silicon carbide transistor is much lower than that of a similar silicon device.

In light of the above, there is a present need for silicon carbide transistor devices with improved short circuit protection.

SUMMARY

In one embodiment, a transistor semiconductor die includes a first current terminal, a second current terminal, and a control terminal. A semiconductor structure is between the first current terminal, the second current terminal, and the control terminal and configured such that a resistance between the first current terminal and the second current terminal is based on a control signal provided at the control terminal. Short circuit protection circuitry is coupled between the control terminal and the second current terminal. In a normal mode of operation, the short circuit protection circuitry is configured to provide a voltage drop between the control terminal and the second current terminal that is greater than a voltage of the control signal. In a short circuit protection mode of operation, the short circuit protection circuitry is configured to provide a voltage drop between the control terminal and the second current terminal that is less than a voltage of the control signal. Accordingly, the short circuit protection circuit is configured to protect the transistor semiconductor die from failure due to a short circuit condition while not interfering with the operation of the transistor semiconductor die in a normal mode of operation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
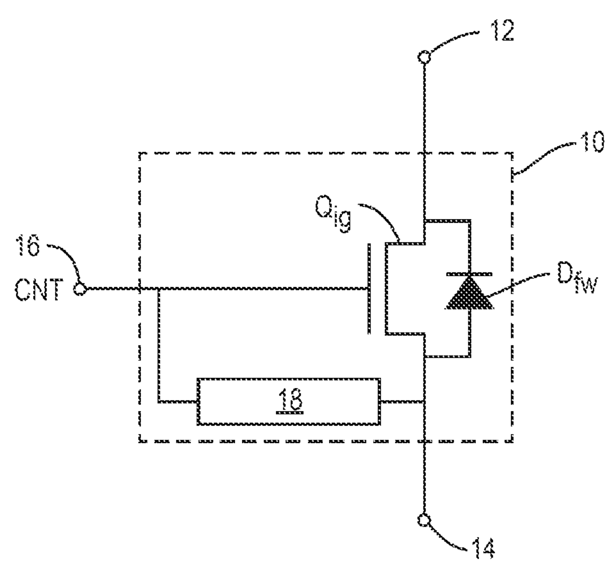
FIG. 1 is a schematic representation of a transistor semiconductor die according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a schematic representation of a transistor semiconductor die 10 according to one embodiment of the present disclosure. The transistor semiconductor die 10 includes a first current terminal 12, a second current terminal 14, and a control terminal 16. A semiconductor structure between the first current terminal 12, the second current terminal 14, and the control terminal 16 forms a transistor device $Q_{ig}$ such that a resistance between the first current terminal 12 and the second current terminal 14 is based on a control signal CNT provided at the control terminal 16. As shown in FIG. 1, the transistor device $Q_{ig}$ is a metal-oxide semiconductor field-effect transistor (MOSFET). Accordingly, the first current terminal 12 is a drain terminal, the second current terminal 14 is a source terminal, and the control terminal 16 is a gate terminal. However, the principles of the present disclosure apply equally to any transistor device such as an insulated gate bipolar transistor (IGBT). In the case of an IGBT, the first current terminal 12 is a collector terminal, the second current terminal 14 is an emitter terminal, and the control terminal 16 is a gate terminal. Since the transistor device $Q_{ig}$ may be used for power electronics, a freewheeling anti-parallel diode $D_{fw}$ may be coupled in anti-parallel with the transistor device $Q_{ig}$ so that current can be conducted bidirectionally between the first current terminal 12 and the second current terminal 14. In various embodiments, the freewheeling diode $D_{fw}$ may be external from the transistor device $Q_{ig}$, or may be internal to the transistor device $Q_{ig}$, e.g., a body diode.

While the transistor device $Q_{ig}$ is shown herein as an insulated gate device, the principles of the present disclosure apply equally to any transistor device such as bipolar junction transistors (BJTs), and junction field-effect transistors (JFETs). In the case of a BJT, the first current terminal 12 is a collector terminal, the second current terminal 14 is an emitter terminal, and the control terminal 16 is a base terminal. In the case of a JFET, the first current terminal 12 is a drain terminal, the second current terminal 14 is a source terminal, and the control terminal 16 is a gate terminal. Further, the transistor device $Q_{ig}$ may be a thyristor. In the case of a thyristor, the first current terminal 12 is an anode, the second current terminal 14 is a cathode, and the control terminal 16 is a gate terminal.

The transistor semiconductor die 10 may utilize a wide bandgap material system such as silicon carbide. As discussed above, the silicon carbide transistor semiconductor die 10 may be more sensitive to short circuit events than their silicon counterparts due to the smaller size and higher current density thereof. Accordingly, short circuit protection circuitry 18 is coupled between the control terminal 16 and the second current terminal 14. The short circuit protection circuitry 18 is configured to operate in a normal mode of operation and a short circuit protection mode of operation. In the normal mode of operation, the short circuit protection circuitry 18 is configured to provide a voltage drop between the control terminal 16 and the second current terminal 14 that is greater than a voltage of the control signal CNT. In the short circuit protection mode of operation, the short circuit protection circuitry 18 is configured to provide a voltage drop between the control terminal 16 and the second current terminal 14 that is less than a voltage of the control signal CNT. In the normal mode of operation when a voltage drop across the short circuit protection circuitry 18 is greater than a voltage of the control signal CNT, the operation of the transistor device $Q_{ig}$ is relatively unaffected. In the short circuit protection mode of operation when a voltage drop across the short circuit protection circuitry 18 is less than a voltage of the control signal CNT, a voltage at the control terminal 16 is lowered such that voltage between the control terminal 16 and the second current terminal 14 (i.e., the gate-to-source voltage of the transistor device $Q_{ig}$) is reduced, which in turn partially or completely shuts off the device. Shutting off the transistor device $Q_{ig}$ protects the device during a short circuit event in order to prevent a failure.

One way in which the above-mentioned functionality may be accomplished is by providing the short circuit protection circuitry 18 such that it has a negative temperature coefficient with respect to a voltage drop across the short circuit protection circuitry 18. In other words, the short circuit protection circuitry 18 may be provided such that a voltage drop across the short circuit protection circuitry 18 decreases as temperature increases. Since during a short circuit event a temperature of the transistor semiconductor die 10 will rapidly increase far above normal operating temperatures thereof, the short circuit protection circuitry 18 may significantly reduce a voltage drop between the control terminal 16 and the second current terminal 14 only when a short circuit event occurs. Note that this functionality requires adequate thermal coupling between the short circuit protection circuitry 18 and the current carrying portion of the transistor semiconductor die 10.

Notably, the short circuit protection circuitry 18 is located on the transistor semiconductor die 10. As discussed in detail below, the short circuit protection circuitry 18 takes up minimal area on the transistor semiconductor die 10 and may be capable of extending a short circuit withstand time of the transistor semiconductor die 10 significantly, and in some cases indefinitely.

Figure 2:
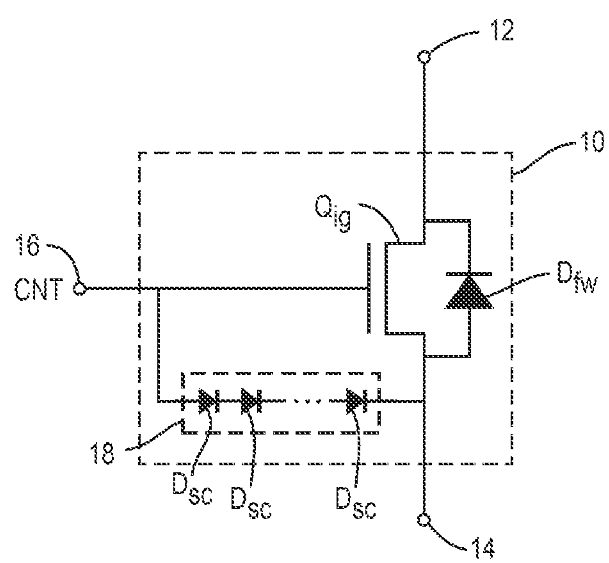
FIG. 2 is a schematic representation of a transistor semiconductor die according to one embodiment of the present disclosure.

FIG. 2 is a schematic representation of the transistor semiconductor die 10 showing details of the short circuit protection circuitry 18 according to one embodiment of the present disclosure. As shown in FIG. 2, the short circuit protection circuitry 18 may include a number of short circuit protection diodes $D_{sc}$ coupled in series between the control terminal 16 and the second current terminal 14. In particular, the short circuit protection diodes $D_{sc}$ are coupled anode-to-cathode between the control terminal 16 and the second current terminal 14 such that an anode of a first one of the short circuit protection diodes $D_{sc}$ is coupled to the control terminal 16 and a cathode of a last one of the short circuit protection diodes $D_{sc}$ is coupled to the second current terminal 14. As discussed above, the short circuit protection diodes $D_{sc}$ may be provided with a negative temperature coefficient (e.g., an exponential negative temperature coefficient) with respect to a forward voltage drop thereof. In other words, the short circuit protection diodes $D_{sc}$ may be provided such that a forward voltage drop across the diodes decreases as temperature increases. Such a negative temperature coefficient is naturally present in silicon carbide diodes. The negative temperature coefficient enables a voltage drop across the short circuit protection diodes $D_{sc}$ to be greater than a voltage of the control signal CNT in the normal mode of operation (and thus not interfere with the operation of the transistor device $Q_{ig}$) and be less than a voltage of the control signal CNT in the short circuit protection mode of operation (thus partially or completely turning off the transistor device $Q_{ig}$). Note that this functionality requires adequate thermal coupling between the short circuit protection circuitry 18 and the current carrying portion of the transistor semiconductor die 10. The number of short circuit protection diodes $D_{sc}$ may be chosen such that when a temperature of the transistor semiconductor die 10 is below a short circuit threshold temperature a voltage drop across the short circuit protection diodes $D_{sc}$ is greater than or equal to a voltage of the control signal CNT and when a temperature of the transistor semiconductor die 10 is above the short circuit threshold temperature a voltage drop across the short circuit protection diodes $D_{sc}$ is significantly less than the voltage of the control signal CNT such that a voltage at the control terminal 16 is lowered enough to partially or completely turn off the transistor device $Q_{ig}$.

In addition to protecting the transistor device $Q_{ig}$ against short circuit events, the short circuit protection circuitry 18 also clamps the maximum voltage of the gate to the combined forward voltage drop of the short circuit protection diodes $D_{sc}$. This has the additional benefits of protecting the transistor device $Q_{ig}$ against electrostatic discharge (ESD) and provides voltage overshoot protection for the gate of the transistor device $Q_{ig}$.

The short circuit protection circuitry 18 may enable significant improvements in the short circuit withstand time of the transistor semiconductor die 10. As discussed herein, the short circuit protection circuitry 18 may require minimal active area on the transistor semiconductor die 10. In various embodiments, an on-state resistance of the transistor semiconductor die 10 may be between 0.1 mΩ/cm$^2$ and 3.0 mΩ/cm$^2$, a blocking voltage of the transistor semiconductor die 10 may be between 600V and 10 kV, and a short circuit withstand time of the transistor semiconductor die 10 may be greater than 3 μs. Notably, the on-state resistance of the transistor semiconductor die 10 may fall anywhere in the above range, such as between 0.5 mΩ/cm$^2$ and 3.0 mΩ/cm$^2$, between 1.0 mΩ/cm$^2$ and 3.0 mΩ/cm$^2$, between 1.5 mΩ/cm$^2$ and 3.0 mΩ/cm$^2$, between 2.0 mΩ/cm$^2$ and 3.0 mΩ/cm$^2$, between 2.5 mΩ/cm$^2$ and 3.0 mΩ/cm$^2$, and the like. The blocking voltage of the transistor semiconductor die 10 may similarly fall anywhere inside the above range, such as between 600V and 1 kV, between 600V and 2 kV, between 600V and 5 kV, between 1 kV and 5 kV, between 5 kV and 10 kV, and the like. A relationship between the on-state resistance and the blocking voltage of the transistor semiconductor die 10 may be expressed according to Equation (1):

$$R_{on}=0.8\times(3\times10^{-8})\times V_{block}^{2.4} \quad (1)$$

where $R_{on}$ is the on-state resistance of the transistor semiconductor die and $V_{block}$ is the blocking voltage of the transistor semiconductor die 10.

The short circuit withstand time of the transistor semiconductor die 10 may be less than 10 s in some embodiments, but the principles of the present disclosure may also enable the transistor semiconductor die 10 to indefinitely withstand a short circuit event in some circumstances. The short circuit withstand time of the transistor semiconductor die 10 may fall anywhere in the above ranges such that the short circuit withstand time is between 4 μs and 10 s, between 5 μs and 10 s, between 10 μs and 10 s, between 50 μs and 10 s, between 5 ms and 10 s, between 10 ms and 10 s, between 50 ms and 10 s, between is and 10 s, and the like.

Figure 3:
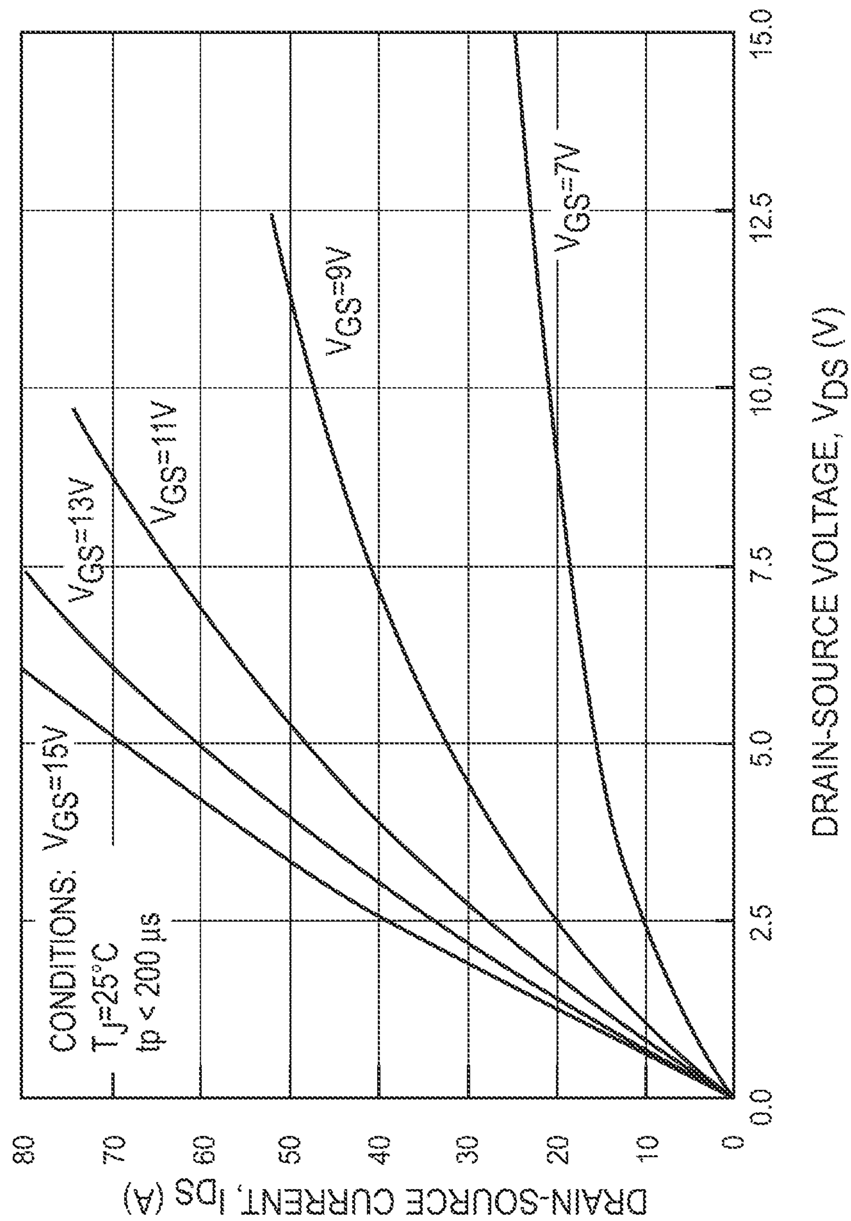
FIG. 3 is a graph illustrating a relationship between drain-source voltage, drain-source current, and gate-source voltage for a metal-oxide semiconductor field-effect transistor (MOSFET) according to one embodiment of the present disclosure.

FIG. 3 is a graph illustrating a relationship between drain-source voltage, drain-source current, and gate-source voltage in a MOSFET. As shown, a relationship between drain-source voltage and drain-source current is dependent on gate-source voltage such that as the gate-source voltage increases, a steepness of the curve between drain-source voltage and drain-source current increases. Accordingly, higher gate-source voltages will lead to higher drain-source currents during a short circuit event. When a drain-source current becomes high enough, the device will fail. By reducing the gate-source voltage during a short circuit event, the drain-source current is significantly reduced such that a failure of the device can be prevented.

Figure 4:
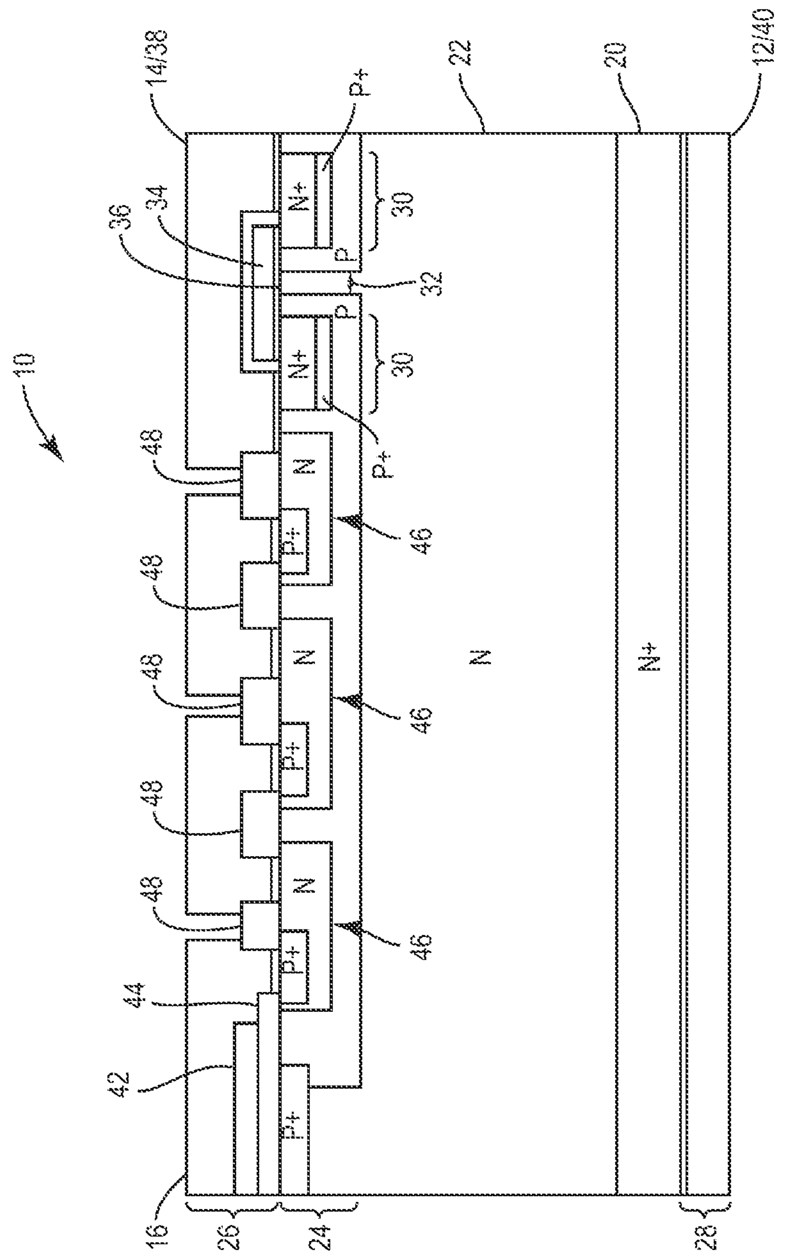
FIG. 4 is a cross-sectional view of a portion of a transistor semiconductor die according to one embodiment of the present disclosure.

FIG. 4 is a cross-sectional view of a portion of the transistor semiconductor die 10 according to one embodiment of the present disclosure. The transistor semiconductor die 10 includes a substrate 20, a drift layer 22 on the substrate 20, a number of implants 24 in the drift layer 22, a top metallization layer 26, and a bottom metallization layer 28. In particular, on the right side of the transistor semiconductor die 10 the transistor device $Q_{ig}$ is provided as a vertical MOSFET including a pair of junction implants 30 in the drift layer 22 such that the junction implants 30 are separated by a JFET gap 32. A gate contact 34 on top of a gate oxide layer 36 runs between the junction implants 30 on a surface of the drift layer 22 opposite the substrate 20. A source contact 38 (which may also be the second current terminal 14) also contacts each one of the junction implants 30 on the surface of the drift layer 22 opposite the substrate. A drain contact 40 (which may also be the first current terminal 12) is on the substrate 20 opposite the drift layer 22. The source contact 38 is provided by a portion of the top metallization layer 26. The drain contact 40 is provided by the bottom metallization layer 28.

On the left side of the transistor semiconductor die 10, the control terminal 16 is provided by a portion of the top metallization layer 26. While not shown, the control terminal 16 is coupled to the gate contact 34 of the transistor device $Q_{ig}$ on a plane not shown in the cross-section (e.g., via a gate runner 42 provided on a field oxide layer 44 below the top metallization layer 26). The control terminal 16 is also coupled to the source contact 38 of the transistor device $Q_{ig}$ through a number of P-N junctions 46 formed in the drift layer 22. Each one of these P-N junctions 46 forms one of the short circuit protection diodes $D_{sc}$ discussed above with respect to FIG. 2. The top metallization layer 26 is appropriately patterned to form connections between the control terminal 16 and the source contact 38 through the P-N junctions 46 as shown. An intermetal dielectric layer 48 may insulate different portions of the top metallization layer 26 to form the desired connection pattern.

While only one unit cell of the transistor device $Q_{ig}$ is shown in FIG. 4, the transistor device $Q_{ig}$ may comprise any number of cells coupled together to provide a desired forward current rating of the transistor semiconductor die 10. Further, while the short circuit protection diodes $D_{sc}$ are shown one next to another in the drift layer 22 in FIG. 4, the short circuit protection diodes $D_{sc}$ may be distributed in any suitable manner in the transistor semiconductor die 10. For example, the short circuit protection diodes $D_{sc}$ may be distributed between different cells of the transistor device $Q_{ig}$ in a pattern in order to reduce the total active area devoted to the short circuit protection diodes $D_{sc}$. In general, the short circuit protection diodes $D_{sc}$ will consume very little area when compared to the transistor device $Q_{ig}$ and thus will have a minimal impact on the total active area of the transistor semiconductor die 10.

Figure 5:
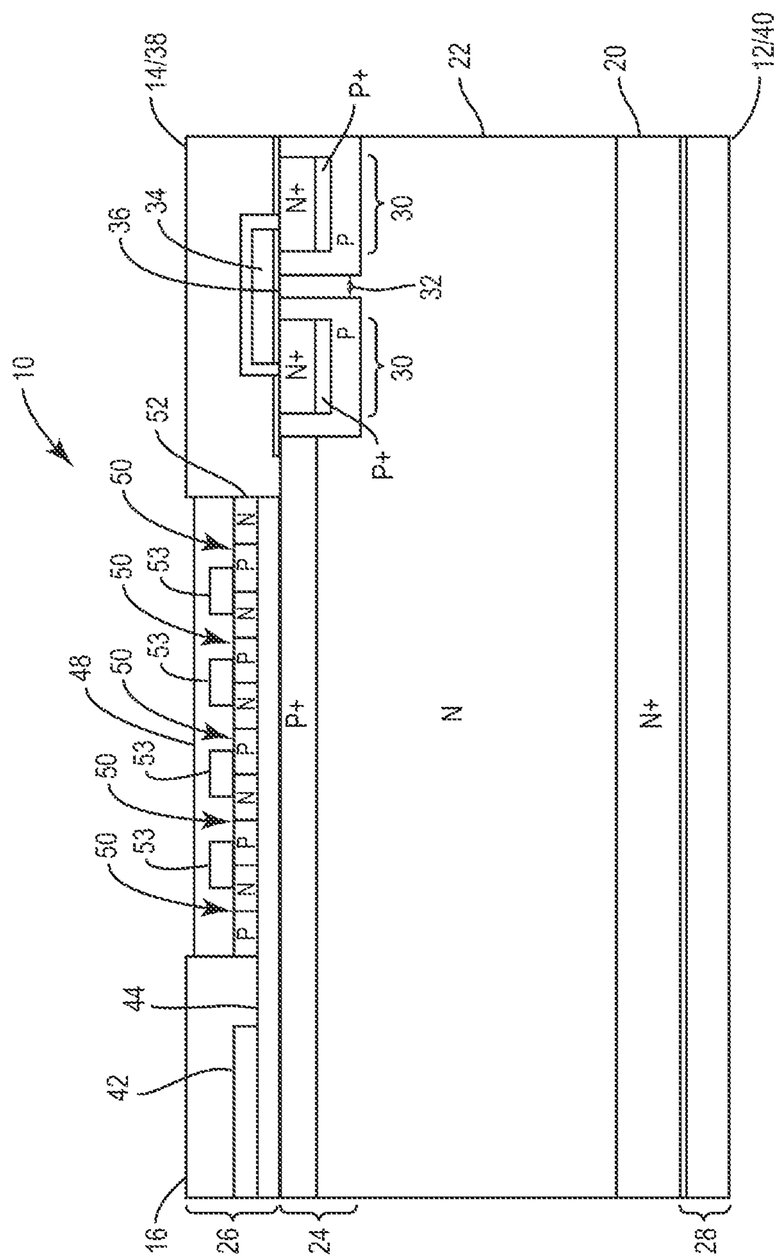
FIG. 5 is a cross-sectional view of a portion of a transistor semiconductor die according to one embodiment of the present disclosure.

FIG. 5 shows the transistor semiconductor die 10 according to an additional embodiment of the present disclosure. The transistor semiconductor die 10 shown in FIG. 5 is substantially similar to that shown in FIG. 4, except that the short circuit protection diodes $D_{sc}$ are provided as a number of P-N junctions 50 formed in an additional semiconductor layer 52 (e.g., a polysilicon layer) that is provided on the drift layer 22 (with the field oxide layer 44 between the additional semiconductor layer 52 and the drift layer 22 to avoid interaction between the layers). A number of metal jumpers 53 may be provided between each adjacent P-N junction 50. In the embodiment shown in FIG. 5 the short circuit protection diodes $D_{sc}$ may be Zener diodes. In such an embodiment, the short circuit protection diodes $D_{sc}$ are coupled in series cathode-to-anode between the insulted gate terminal 16 and the second current terminal 14 such that a cathode of a first one of the short circuit protection diodes $D_{sc}$ is coupled to the control terminal 16 and an anode of a last one of the short circuit protection diodes $D_{sc}$ is coupled to the second current terminal 14. However, the P-N junctions 50 in FIG. 5 may be reversed such that they are coupled anode-to-cathode between the insulated gate terminal 16 and the second current terminal 14 as shown. Providing the short circuit protection diodes $D_{sc}$ in the additional semiconductor layer 52 that is provided on the drift layer 22 may allow a reduction or elimination of the active area devoted to the short circuit protection circuitry 18, since the short circuit protection diodes $D_{sc}$ can be moved over the transistor device $Q_{ig}$ in some embodiments.

Figure 6:
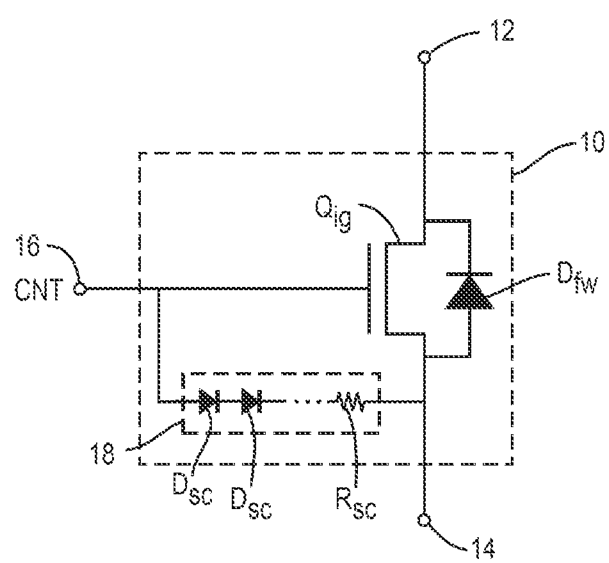
FIG. 6 is a schematic representation of a transistor semiconductor die according to one embodiment of the present disclosure.

FIG. 6 is a schematic representation of the transistor semiconductor die 10 according to an additional embodiment of the present disclosure. The transistor semiconductor die 10 shown in FIG. 6 is substantially similar to that shown in FIG. 2, except that the short circuit protection circuitry 18 further includes a short circuit protection resistive element $R_{sc}$ coupled in series with the short circuit protection diodes $D_{sc}$. The short circuit protection resistive element $R_{sc}$ may be used to achieve a precise voltage drop across the short circuit protection circuitry 18 that may be difficult to achieve using diodes alone. Since using only diodes in the short circuit protection circuitry 18 effectively limits the total voltage drop across the short circuit protection circuitry 18 to integer multiples of the forward voltage drop of the diodes, providing the short circuit protection resistive element $R_{sc}$ allows for more precise tuning of the voltage drop across the short circuit protection circuitry 18. The short circuit protection circuitry 18 may be provided with a negative temperature coefficient with respect to the resistance thereof, such that as the temperature of the transistor semiconductor die 10 increases, the resistance of the short circuit protection resistive element $R_{sc}$ decreases.

Figure 7:
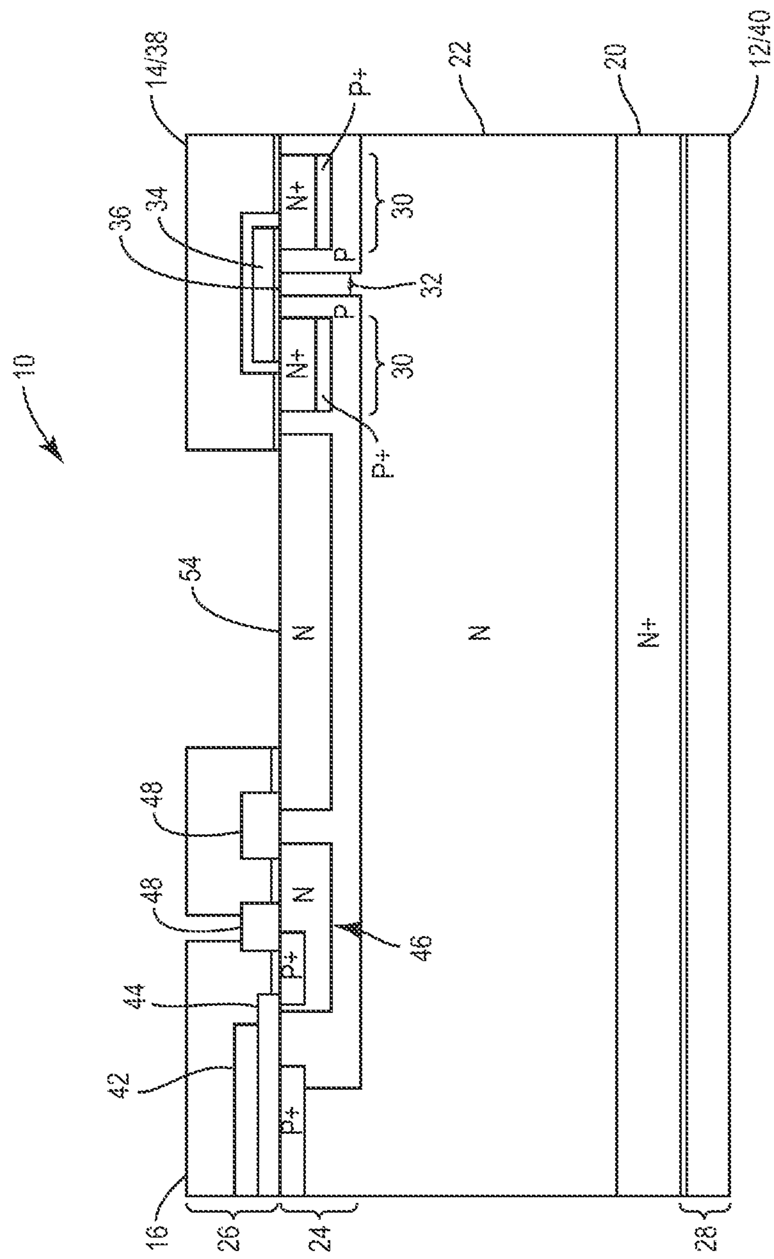
FIG. 7 is a cross-sectional view of a transistor semiconductor die according to one embodiment of the present disclosure.

FIG. 7 is a cross-sectional view of a portion of the transistor semiconductor die 10 according to an additional embodiment of the present disclosure. The transistor semiconductor die 10 shown in FIG. 7 is substantially similar to that shown in FIG. 4, except that the transistor semiconductor die 10 further includes the short circuit protection resistive element $R_{sc}$ coupled between the control terminal 16 and the second current terminal 14. The short circuit protection resistive element $R_{sc}$ may be implemented using a deep N-doped well 54. Providing the short circuit protection resistive element $R_{sc}$ in this manner may ensure a negative temperature coefficient with respect to resistance. While not shown, in other embodiments, the short circuit protection resistive element $R_{sc}$ may be implemented using a highly doped polysilicon resistor, a metal resistor with sufficiently high positive temperature coefficient with respect to resistance, or any other suitable type of resistive element.

Figure 8:
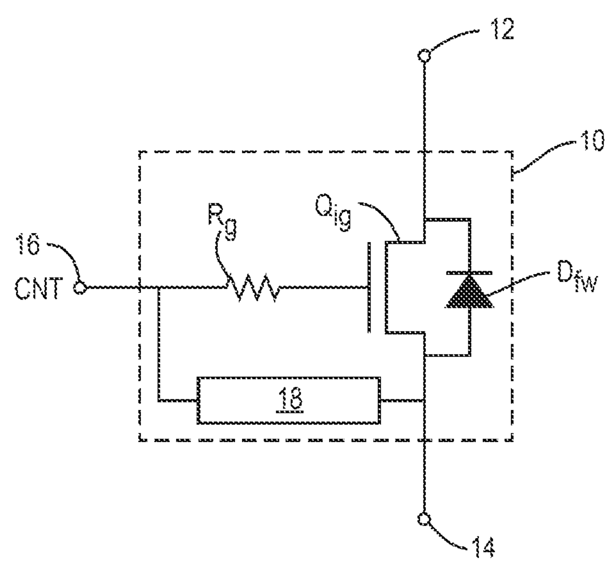
FIG. 8 is a schematic representation of a transistor semiconductor die according to one embodiment of the present disclosure.

FIG. 8 is a schematic representation of the transistor semiconductor die 10 according to an additional embodiment of the present disclosure. The transistor semiconductor die 10 shown in FIG. 8 is substantially similar to that shown in FIG. 1, except that the transistor semiconductor die 10 further includes a gate resistive element $R_g$ coupled between the control terminal 16 and a gate of the transistor device $Q_{ig}$. The gate resistive element $R_g$ is provided with a positive temperature coefficient with respect to a resistance thereof In other words, a resistance of the gate resistive element $R_g$ increases as a temperature of the transistor semiconductor die 10 increases. Note that this functionality requires adequate thermal coupling between the short circuit protection circuitry 18 and the current carrying portion of the transistor semiconductor die 10. This may reduce a gate drive current in the event of a short circuit event, thereby enhancing the action of the short circuit protection circuitry 18.

Figure 9:
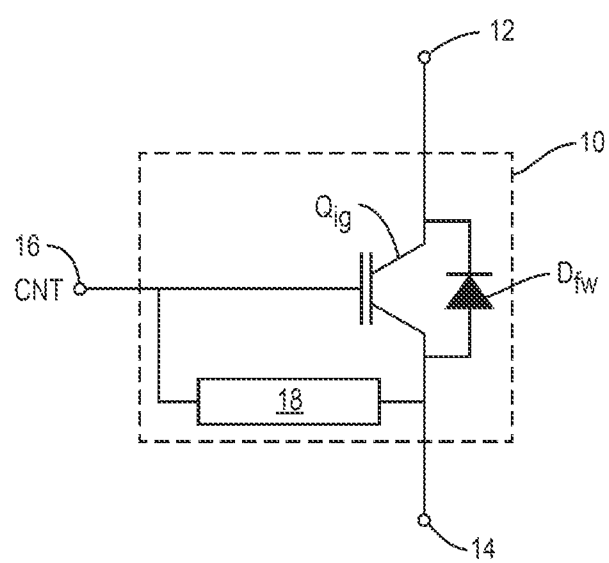
FIG. 9 is a schematic representation of a transistor semiconductor die according to one embodiment of the present disclosure.
Figure 10:
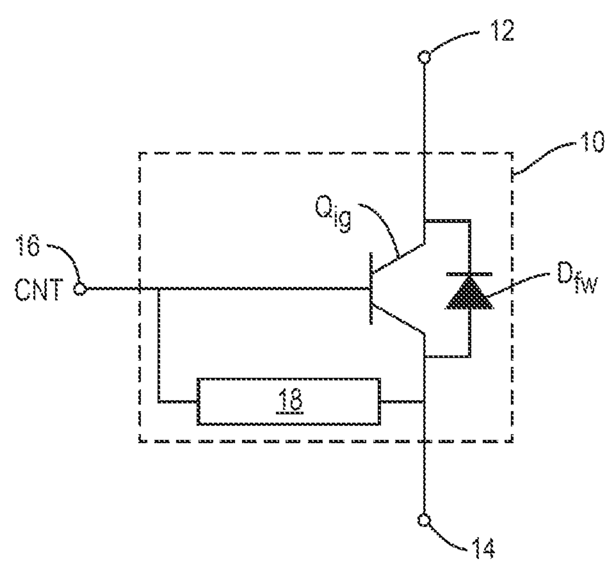
FIG. 10 is a schematic representation of a transistor semiconductor die according to one embodiment of the present disclosure.
Figure 11:
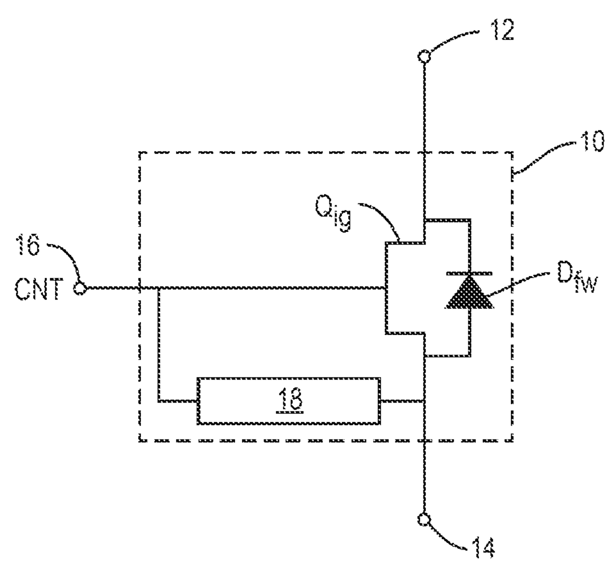
FIG. 11 is a schematic representation of a transistor semiconductor die according to one embodiment of the present disclosure.

As discussed above, while the foregoing examples of transistor semiconductor die 10 are primarily shown depicting the transistor device $Q_{ig}$ as a MOSFET, the principles of the present disclosure apply equally to any type of transistor devices including IGBTs, BJTs, JFETs, and the like. Accordingly, for the sake of completeness FIG. 9 shows a schematic view of the transistor semiconductor die 10 wherein the transistor device $Q_{ig}$ is an IGBT instead of a MOSFET. In this case, the first current terminal 12 is a collector terminal and the second current terminal 14 is an emitter terminal. Those skilled in the art will readily appreciate that the MOSFET depicted in the cross-sectional views of the transistor semiconductor die 10 shown above can be readily replaced with an IGBT, for example, by adding an injector layer between the substrate 20 and the drift layer 22. FIG. 10 shows a schematic view of the transistor semiconductor die 10 wherein the transistor device $Q_{ig}$ is a BJT instead of a MOSFET. In this case, the first current terminal 12 is a collector terminal, the second current terminal 14 is an emitter terminal, and the control terminal 14 is a base terminal. Those skilled in the art will readily appreciate that the MOSFET depicted in the cross-sectional views of the transistor semiconductor die 10 shown above can be readily replaced with a BJT. FIG. 11 shows a schematic view the transistor semiconductor die 10 wherein the transistor device $Q_{ig}$ is a JFET instead of a MOSFET. In this case, the first current terminal 12 is a drain terminal, the second current terminal 14 is a source terminal, and the control terminal 16 is a gate terminal. Those skilled in the art will readily appreciate that the MOSFET depicted in the cross-sectional views of the transistor semiconductor die 10 shown above can be readily replaced with a JFET.

Those skilled in the art will recognize improvements and modifications to the preferred embodiments of the present disclosure. All such improvements and modifications are considered within the scope of the concepts disclosed herein and the claims that follow.

The invention claimed is:

1. A transistor semiconductor die comprising:

a first current terminal and a second current terminal;

a control terminal;

a semiconductor structure between the first current terminal and the second current terminal; and short circuit protection circuitry comprising at least a first diode coupled in series between the control terminal and the second current terminal, wherein the first diode has a negative temperature coefficient with respect to a voltage drop across the first diode so that the first diode turns on in a short circuit protection mode of operation, wherein the short circuit protection circuitry is configured to operate in the short circuit protection mode of operation in response to a temperature of the transistor semiconductor die exceeding a short circuit threshold temperature.

2. The transistor semiconductor die of claim 1, wherein the short circuit protection circuitry is configured to:

in a normal mode of operation, provide a voltage drop between the control terminal and the second current terminal that is greater than a voltage of a control signal provided at the control terminal; and in the short circuit protection mode of operation, provide a voltage drop between the control terminal and the second current terminal that is less than a voltage of the control signal.

3. The transistor semiconductor die of claim 2, further comprising a resistive element coupled between the control terminal and a gate of a semiconductor device implemented in the transistor semiconductor die, wherein the resistive element has a negative temperature coefficient with respect to a resistance thereof.

4. The transistor semiconductor die of claim 2, wherein the semiconductor structure comprises a drift layer, and wherein the first diode resides within the drift layer.

5. The transistor semiconductor die of claim 2, wherein the first diode is provided in an additional semiconductor layer on the semiconductor structure.

6. The transistor semiconductor die of claim 1, wherein the short circuit protection circuitry further comprises a second diode, wherein the first and second diodes are coupled in series, and wherein an anode of the first diode is coupled to the control terminal and a cathode of the second diode is coupled to the second current terminal.

7. The transistor semiconductor die of claim 1, wherein the short circuit protection circuitry is configured to reduce a voltage drop between the control terminal and the second current terminal in response to the first diode turning on.

8. The transistor semiconductor die of claim 2, wherein:

the short circuit protection circuitry is configured to operate in the normal mode of operation when the temperature of the transistor semiconductor die is below the short circuit threshold temperature.

9. The transistor semiconductor die of claim 1, wherein the semiconductor structure comprises silicon carbide.

10. A transistor semiconductor die comprising:

a first current terminal and a second current terminal;

a control terminal;

a semiconductor structure between the first current terminal and the second current terminal;

a gate resistive element coupled between the control terminal and a gate of the transistor semiconductor die, wherein the gate resistive element has a positive temperature coefficient with respect to a resistance thereof; and short circuit protection circuitry comprising a plurality of diodes coupled in series between the control terminal and the second current terminal.

11. The transistor semiconductor die of claim 10, wherein at least one of the plurality of diodes has a negative temperature coefficient with respect to a voltage drop across the at least one of the plurality of diodes.

12. The transistor semiconductor die of claim 10, wherein the gate resistive element is thermally coupled to a current carrying portion of the transistor semiconductor die.

13. A transistor semiconductor die comprising:

a first current terminal and a second current terminal;

a control terminal;

a semiconductor structure between the first current terminal and the second current terminal, the semiconductor structure comprising a first conductivity type well region; and short circuit protection circuitry comprising one or more diodes and a resistive element coupled in series between the control terminal and the second current terminal, wherein the resistive element comprises a second conductivity type semiconductor region in the first conductivity type well region.

14. The transistor semiconductor die of claim 13, wherein at least one of the one or more diodes has a negative temperature coefficient with respect to a voltage drop across the one or more diodes.

15. The transistor semiconductor die of claim 14, wherein:

the transistor semiconductor die is configured to operate in a normal mode of operation when a temperature of the semiconductor structure is below a short circuit threshold temperature; and the transistor semiconductor die is configured to operate in a short circuit protection mode of operation when a temperature of the semiconductor structure is above the short circuit threshold temperature.

16. The transistor semiconductor die of claim 13, wherein the resistive element has a negative temperature coefficient with respect to a resistance thereof.

17. The transistor semiconductor die of claim 1, wherein an on-state resistance of the transistor semiconductor die is less than 3.0 $m\Omega/cm^2$, a blocking voltage of the transistor semiconductor die is greater than 600V, and a short circuit withstand time of the transistor semiconductor die is greater than 3 μs.

18. The transistor semiconductor die of claim 17, wherein the on-state resistance of the transistor semiconductor die is greater than 0.1 $m\Omega/cm^2$, the blocking voltage of the transistor semiconductor die is less than 10 kV, and a short circuit withstand time of the transistor semiconductor die is less than 10 s.

19. The transistor semiconductor die of claim 13, wherein the semiconductor structure comprises a drift layer, and wherein the one or more diodes reside within the drift layer.

20. The transistor semiconductor die of claim 13, wherein the semiconductor structure comprises silicon carbide.

21. A transistor semiconductor die comprising:

a first current terminal and a second current terminal;

a control terminal;

a semiconductor structure between the first current terminal and the second current terminal; and protection circuitry comprising a plurality of protection elements that comprise at least a first diode coupled between the control terminal and the second current terminal, wherein the first diode has a negative temperature coefficient with respect to a voltage drop across the first diode so that the protection circuitry at least partially shuts off the semiconductor structure in a protection event, wherein, in the protection event, the protection circuitry is configured to clamp a voltage provided at a gate of a semiconductor device implemented in the transistor semiconductor die to a combined forward voltage drop of the plurality of protection elements.

22. The transistor semiconductor die of claim 1, wherein the transistor semiconductor die is configured to at least partially turn off in response to the first diode turning on.

23. The transistor semiconductor die of claim 21, wherein the first diode is configured to turn on in the protection event.

24. The transistor semiconductor die of claim 21, wherein the protection circuitry is configured to reduce a voltage drop between the control terminal and the second current terminal in the protection event.

25. The transistor semiconductor die of claim 21, wherein the protection event is a short circuit condition between the first current terminal and the second current terminal.

26. The transistor semiconductor die of claim 21, wherein the protection circuitry is configured to at least partially shut off the semiconductor structure in the protection event in response to a temperature of the transistor semiconductor die exceeding a threshold value.

* * * * *